US006467676B1

(12) United States Patent
Wang

(10) Patent No.: US 6,467,676 B1
(45) Date of Patent: Oct. 22, 2002

(54) FLUXING ADHESIVE

(75) Inventor: Tie Wang, Singapore (SG)

(73) Assignee: Advanpack Solutions PTE Ltd., Singapore (SG)

( * ) Notice: Subject to any disclaimer, the term of this patent is extended or adjusted under 35 U.S.C. 154(b) by 0 days.

(21) Appl. No.: 09/666,816

(22) Filed: Sep. 21, 2000

(30) Foreign Application Priority Data

Sep. 24, 1999 (SG) ............................................. 9904732

(51) Int. Cl.$^7$ ......................... B23K 31/02; B23K 1/20; C08L 67/00; C08L 23/00
(52) U.S. Cl. .................. 228/180.22; 228/214; 228/215; 525/48; 525/240; 526/213
(58) Field of Search ................................ 228/207, 214, 228/215, 223, 224, 180.22; 525/48, 240; 526/213

(56) References Cited

U.S. PATENT DOCUMENTS

| | | | |
|---|---|---|---|
| 5,121,190 A | * | 6/1992 | Hsiao et al. |
| 5,128,746 A | | 7/1992 | Pennisi et al. ................. 357/72 |
| 5,140,069 A | | 8/1992 | Mülhaupt et al. ............ 525/109 |
| 5,471,027 A | | 11/1995 | Call et al. ................. 219/85.13 |
| 5,700,581 A | | 12/1997 | Sachdev et al. ............. 428/447 |
| 5,821,456 A | * | 10/1998 | Willie et al. |
| 6,059,894 A | | 5/2000 | Pendse ......................... 148/23 |
| 6,180,696 B1 | * | 1/2001 | Wong et al. |
| 6,194,788 B1 | * | 2/2001 | Gilleo et al. |
| 6,210,811 B1 | * | 4/2001 | Honda et al. |
| 6,235,865 B1 | * | 5/2001 | Shimizu et al. |

FOREIGN PATENT DOCUMENTS

| | | |
|---|---|---|
| EP | 134 691 | 3/1985 |
| WO | 98/37134 | 8/1998 |
| WO | WO 99/03597 | 1/1999 |

OTHER PUBLICATIONS

US 2001/0003759 A1 Sato et al. (Jun. 14, 2001).*
Australian Patent Office Search report for Appln. No. SG 9904732–6 Dated Mar. 27, 2002; (5 p.).

* cited by examiner

Primary Examiner—Tom Dunn
Assistant Examiner—Kiley Stoner
(74) Attorney, Agent, or Firm—Conley, Rose & Tayon, P.C.

(57) ABSTRACT

An improved underfill adhesive encapsulant with fluxing activities containing an epoxy resin or a mixture of epoxy resin. An anhydride is used as the curing agent to harden the epoxy resin. A hydroxyl-containing fluxing precursor compound is added to the encapsulant composition to react with the anhydride curing agent to produce an active fluxing agent under typical reflow conditions. The use of a fluxing precursor gives improved reliability compared to conventional fluxing agents used in existing no-flow underfill encapsulants. A suitable catalyst such as imidazole, imidazole derivative or metal acetylacetonate is provided in the present encapsulant at concentrations that give good curing kinetics. A thermoplastic is optionally included to allow the cured encapsulant to be reworked.

17 Claims, 1 Drawing Sheet

FLUXING ADHESIVE

FIELD OF THE INVENTION

The present invention relates to electronic devices. In particular, the present invention relates encapsulation materials for producing electrical interconnections.

BACKGROUND OF THE INVENTION

Solder joints are commonly used for electrical interconnection for electronic devices. In flip chip technology, integrated circuit chips (IC chips) are electrically connected via solder bumps to the input/output (I/O) pads of the substrate. this is done through a solder bumping process in which interconnections between the IC chip and the corresponding substrate is made by melting or reflowing solder bumps placed on the prescribed input/output (I/O) pads of the IC chip. In order to achieve reliable solder interconnections between an IC chip and substrate, or between two substrates, a fluxing agent is typically applied to the I/O pads to rid them of any oxides, because the presence of oxides affect the wetting of the metallic I/O pads, resulting in weak joints upon attachment. Following proper soldering, the fluxing agent is removed by washing, after which an filling material is applied to fill the gap between the IC device and the substrate in order to protect the package from damage. This material is generally known as underfill encapsulant material.

The encapsulant material is generally made from thermoset plastics such as epoxy. There are 3 general types of epoxy resin: bisphenol type, cycloaliphatic type and novolac type. The chemical characteristics and curing reactions are generally disclosed in *Handbook of Epoxy Resin,* by Lee, H. and Neville K., McGraw Hill Book, New York, 1987.

It is known to use an underfill encapsulant material that contains a fluxing agent in order to reduce the number of steps involved in packaging. Using this "no-flow" underfill, the separate fluxing step and the subsequent cleaning steps are eliminated. Instead, the "no-flow" underfill combines the fluxing step and the encapsulation steps together, as disclosed in U.S. Pat. No. 5,128,746.

WO 99/03597 further discloses the use of an acrylic or methacrylic acid as the fluxing agent in combination with a neutralisation agent. This fluxing agent is optionally combined with a resin adhesive system to form a thermally curable adhesive composition. Organic acids are commonly used as fluxing agents, but the kinetics of their redox activity in combination with the curing kinetics of the adhesive is not well characterised. The fluxing agent must maintain good fluxing activities before and during the course of soldering, and the rate of curing must be properly controlled such that hardening occurs only after the proper fluxing and soldering has been completed. However, the uncured encapsulant should have a relatively long storage life for convenience of use. Furthermore, it would be ideal for the adhesive to be reworkable. Lastly, the fluxing agent should not have residual activities that may affect the subsequent solder joint.

SUMMARY OF THE INVENTION

Figure 1A:
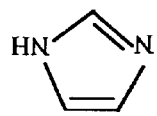
FIGS. 1A–C are the chemical structures of imidazole, 2PHZ or C11Z-CNS respectively.

It is therefore an object of the present invention to provide an improved underfill adhesive that contains fluxing activities.

Accordingly, the present invention provides a no-flow underfill encapsulant containing, in one aspect, an epoxy resin or a mixture of epoxy resin. An anhydride is used as the curing agent to harden the epoxy resin. In another aspect, a hydroxyl-containing fluxing precursor compound is added to the encapsulant composition to react with the anhydride curing agent to produce an active fluxing agent under typical reflow conditions. The use of a fluxing precursor gives improved reliability compared to conventional fluxing agents used in existing no-flow underfill encapsulants. A suitable catalyst such as imidazole, imidazole derivative or metal acetylacetonate is provided in the present encapsulant at concentrations that give good curing kinetics. In a further aspect, a thermoplastic is optionally included to allow the cured encapsulant to be reworked.

The composition is applied directly onto the surface on which the I/O pads for electrical interconnection are provided. This surface may be the substrate, printed circuit board, or any other material in which adhesion and fluxing is desired. The device containing solder material is then placed on the encapsulant material and reflowed.

According to the preferred embodiment, a mixture of bisphenol type epoxy and cycloaliphatic type epoxy is used as the resin. A metal acetylacetonate or an imidazole derivative is used as the catalyst. An anhydride is used as a hardener and glycerol is the hydroxyl-containing fluxing precursor that is used to react with the anhydride derivative under reflow conditions to form an active fluxing agent.

DESCRIPTION OF THE INVENTION

The following detailed description describes several embodiments for implementing the underlying principles of the present invention. One skilled in the art should understand, however, that the following description is meant to be illustrative of the present invention, and should not be construed as limiting the principles discussed herein.

In the following discussion, and in the claims the terms "including", "having" and "comprising" are used in an open-ended fashion, and thus should be interpreted to mean "including but not limited to . . . ".

The three general types of epoxy are:
1. Bisphenol type, including bisphenol A and bisphenol F;
2. Cycloaliphatic type; and
3. Novolac type, including cresol novolac and phenolic novolac.

The encapsulant material according to the present invention includes one of the above types epoxy and preferably a mixture of two of the above types of epoxy. The mixture of different types of epoxy gives improved control over curing kinetics, and is particularly useful as encapsulant material for electronic packages. For a mixture with a total of 100 g, one epoxy type may constitute 20–80 g and the remaining amount consisting of the second epoxy type. The most preferred mixture is bisphenol (A or F) such as EPON 8281 from Shell Corporation combined with a cycloaliphatic type epoxy, such as ERL 4221 from Union Carbide. The ratio of EPON 8281:ERL 4221 is preferably between 3:7 and 7:3.

The preferred curing agent (also known as hardener in the art), is an anhydride, such as tetrahydrophthalic, methyltetrahydrophthalic, methylendomethylenetetrahydrophthalic or hexahydrophthalic anhydride at a concentration of 70–120 g, preferably 75–85 g per 100 g epoxy mixture. In the present invention, the anhydride not only act as the curing agent, but also as a reactant for the esterification reaction to convert the fluxing precursor to an active fluxing compound.

Figure 1B:
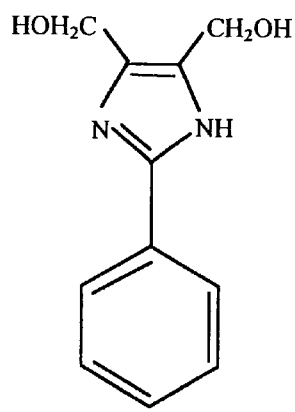
Figure 1C:
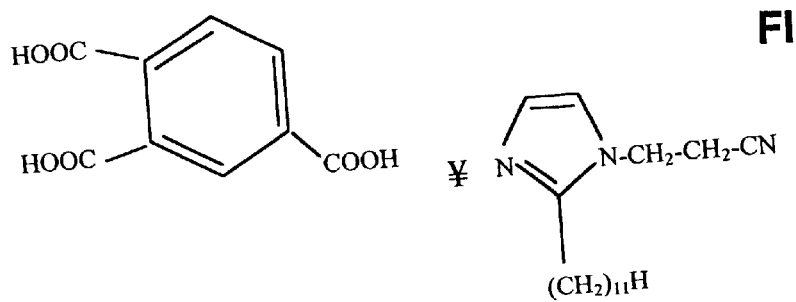

The catalyst for the curing process may be imidazole, metal acetylacetonate or imidazole derivative. The preferred catalyst is Co (II) acetylacetonate at a concentration of 0.36–0.9 g, preferably 0.7–0.8 g per 100 g epoxy mixture.. Another preferred catalyst is imidazole derivative such as 2PHZ or C11Z-CNS at a concentration of 0.18–0.54 g, preferably 0.18–0.24 g per 100 g epoxy mixture. The structures of imidazole, 2PHZ and C11Z-CNS are shown in FIGS. 1A–C.

The fluxing precursor is any hydroxyl-containing compound that reacts in an esterification reaction with anhydride or the prescribed anhydride to form an acid under suitable conditions. The precursor has the general formula R—OH where R can be any group, including, but not limited to, aliphatic or substituted aliphatic group, aromatic or substituted aromatic group. Specific examples include, but are not limited to, glycerol, glycol, poly(ethylene glycol) or poly(propylene glycol).

The fluxing precursor is preferably stable and non-reactive or slowly reactive under storage conditions, e.g. −20° C. to room temperature, and becomes reactive with anhydride to form a suitable amount of acid under reflow conditions, such as 150° C. The concentration of precursor in the encapsulant material depends on the required rate of fluxing, the solder alloy selected and the substrate metallization system. A preferred precursor is glycerol, at a concentration of 1–5 g, preferably 3–5 g per 100 g epoxy resin mixture. Another example of a precursor is glycol at a concentration of 1–5 g, preferably 3–5 g per 100 g epoxy resin mixture.

The following examples illustrate the principles of the present invention, and are not intended to unduly limit the claims thereof. An encapsulation process for the soldering of a chip onto a substrate is used as an example. It is understood that the process may also be used for the reflow soldering and encapsulation of other combinations of electrical components.

EXAMPLE A

An encapsulant material containing a fluxing precursor is prepared according to the following formulation:

| COMPONENT | Amount (g) |
| --- | --- |
| EPON 8281 | 30 |
| ERL 4221 | 70 |
| Hexahydro-4-methylphthalic anhydride | 80 |
| Co (II) acetylacetonate (ACAC) | 0.72 |
| Glycerol | 4.5 |

To produce the Example A encapsulant, EPON 8281, ERL 4221 and hexahydro-4-methylphthalic anhydride are blended to homogeneity at 50° C. after which ACAC is added at the same temperature. Glycerol is then added to the mixture. This encapsulant may be stored at −20° C. for at least 6 months or up to 24 hours at room temperature without affecting the encapsulation and fluxing process under normal reflowing conditions.

For encapsulation, the encapsulant is dispensed onto the substrate surface containing the input/output metallization. An integrated circuit (IC) chip, having solder bumps are picked up and placed onto the dispensed encapsulant such that the solder bumps are directly placed above the corresponding substrate I/O pads. Reflowing may be done under normal reflow profile in the art. This is followed by a post curing step of 150° C. for 30 minutes.

EXAMPLE B

An encapsulant material containing a fluxing precursor is prepared according to the following formulation:

| COMPONENT | Amount (g) |
| --- | --- |
| EPON 8281 | 70 |
| ERL 4221 | 30 |
| 1,2 cyclohexanedicarboxylic Anhydride | 80 |
| 2PHZ | 0.18 |
| Glycerol | 3.6 |

To produce the Example B encapsulant, EPON 8281, ERL 4221 and 1,2 cyclohexanedicarboxylic anhydride are blended to homogeneity at 50° C. after which 2PHZ is added at the same temperature until evenly dispersed. Glycerol is then added to the mixture. This encapsulant may be stored at −20° C. for at least 6 months or up to 24 hours at room temperature without affecting the encapsulation and fluxing process under normal reflowing conditions. Encapsulation is performed under the same conditions as Example A.

EXAMPLE C

An encapsulant material containing a fluxing precursor is prepared according to the following formulation

| COMPONENT | Amount (g) |
| --- | --- |
| EPON 8281 | 30 |
| ERL 4221 | 70 |
| Hexahydro-4-methylphthalic anhydride | 80 |
| Co (II) acetylacetonate (ACAC) | 0.72 |
| Glycerol | 4.5 |
| Poly (1-vinyl) pyrrolidone-co-vinyl acetate (PPVA) | 7 |

To produce the Example C encapsulant, EPON 8281, ERL 4221 and hexahydro-4-methylphthalic anhydride are blended to homogeneity at 50° C. after which the temperature of the mixture is raised to 100° C. and PPVA, a thermoplastic, is dissolved therein. The mixture is then cooled down to 50° C. and ACAC blended evenly into the mixture. The mixture is then cooled to room temperature before glycerol is added. This encapsulant may be stored at −20° C. for at least 6 months or up to 24 hours at room temperature without affecting the encapsulation and fluxing process under normal reflowing conditions. Encapsulation is performed under the same conditions as Example A. Reworking can be performed prior to the post curing step, at 250–300° C., preferably around 250° C.

What is claimed is:

1. An adhesive for use in the reflow soldering of an electronic component and a substrate comprising:
   at least one type of epoxy resin;
   a curing agent consisting essentially of an anhydride;
   a catalyst for the curing reaction of said epoxy;
   a fluxing precursor capable of reacting with said anhydride to form a compound with sufficient fluxing activity to remove oxide coatings from said component or said substrate, wherein said precursor is a hydroxyl-containing organic compound; and
   a thermoplastic resin.

2. An adhesive according to claim 1 wherein said precursor is an organic compound of the general formula R—OH where R is an aliphatic, substituted aliphatic, aromatic or substituted aromatic group.

3. An adhesive according to claim 1 wherein said precursor is glycerol, glycol, poly(ethylene glycol) or poly(propylene glycol).

4. An adhesive according to claim 1 wherein said precursor is glycerol.

5. An adhesive according to claim 1 wherein said precursor is glycerol at an amount of 0.5–5 g per 100 g epoxy resin.

6. An adhesive according to claim 1 wherein said epoxy resin is a mixture of two types selected from a group consisting of the bisphenol type, the cycloaliphatic type, and novolac type.

7. An adhesive according to claim 1 wherein said epoxy resin is a mixture of two types selected from a group consisting of the bisphenol type, the cycloaliphatic type, and novolac type, and said precursor is glycerol at an amount of 0.5–5 g per 100 g epoxy resin mixture.

8. An adhesive according to claim 1 wherein said epoxy resin is a mixture of a Bisphenol A resin and a cycloaliphatic, at a ratio of between 3:7 and 7:3.

9. An adhesive according to claim 1 wherein said anhydride hardener is hexahydro-4-methylphthalic anhydride or 1,2 cyclohexanedicarboxylic anhydride.

10. An adhesive according to claim 1 wherein said catalyst is imidazole, an imidazole derivative or a metal acetylacetonate.

11. An adhesive according to claim 1 wherein said catalyst is 2PHZ or C11Z-CNS.

12. An adhesive according to claim 1 wherein said catalyst is cobalt (II) acetylacetonate.

13. An adhesive according to claim 1 wherein said thermoplastic is poly(1-vinyl) pyrrolidone-co-vinyl acetate.

14. An adhesive according to claim 1 wherein said thermoplastic at an amount of 5–10 g per 100 g epoxy resin or epoxy resin mixture.

15. An adhesive according to claim 1 wherein said thermoplastic comprises any one from the group comprising an ethylene-vinyl alcohol copolymer, a pyrrolidone-vinyl alcohol, and a hydroxyl-carboxylic-anhydride-epoxide-functionalized polyolefinic resin.

16. An adhesive for use in the reflow soldering of an electronic component and a substrate comprising:

at least one type of epoxy resin;

a curing agent consisting essentially of an anhydride;

a catalyst for the curing reaction of said epoxy, wherein said catalyst is 2PHZ or C11Z-CNS;

a fluxing precursor capable of reacting with said anhydride to form a compound with sufficient fluxing activity to remove oxide coatings from said component or said substrate; and a thermoplastic resin, wherein said thermoplastic is poly(1-vinyl) pyrrolidone-co-vinyl acetate.

17. A method of encapsulating a solder joint between a first and a second electronic component using an encapsulant, said method comprising dispensing said encapsulant having at least one type of epoxy resin; a curing agent consisting essentially of an anhydride; a catalyst for the curing reaction of said epoxy; a fluxing precursor capable of reacting with said anhydride to form a compound with sufficient fluxing activity to remove oxide coatings from said component or said substrate, wherein said precursor is a hydroxyl-containing organic compound, and a thermoplastic onto input/output pads of said second component; placing said first component having solder bumps on at least one side onto said second component such that said solder bumps are in contact with said pads; reflowing said solder bumps such that a reliable electrical interconnection is obtained between said first and second components, cooling said interconnected components, and wherein after reflowing, reworking comprises the step of detaching said first component from said second component.

* * * * *